(12) United States Patent
Chen

(10) Patent No.: US 11,270,755 B1
(45) Date of Patent: Mar. 8, 2022

(54) FLASH MEMORY DEVICE AND CONTROL METHOD

(71) Applicant: MACRONIX International Co., Ltd., Hsinchu (TW)

(72) Inventor: Chung-Kuang Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/132,999

(22) Filed: Dec. 23, 2020

(51) Int. Cl.
*G11C 11/4074* (2006.01)
*G11C 11/4099* (2006.01)
*G11C 5/06* (2006.01)

(52) U.S. Cl.
CPC ............ *G11C 11/4074* (2013.01); *G11C 5/06* (2013.01); *G11C 11/4099* (2013.01)

(58) Field of Classification Search
CPC .... G11C 11/4074; G11C 5/06; G11C 11/4099
See application file for complete search history.

(56) References Cited

U.S. PATENT DOCUMENTS

2019/0295667 A1* 9/2019 Yang ................... G11C 16/0483
2020/0090756 A1* 3/2020 Shimura ............. G11C 11/5671

* cited by examiner

*Primary Examiner* — Tri M Hoang
(74) *Attorney, Agent, or Firm* — J.C. Patents

(57) ABSTRACT

A memory cell strings respectively have a plurality of string selecting switches, wherein the plurality of string selecting switches are controlled by a string selecting control voltage. The string selecting control voltage generator is coupled to the memory cell strings, and generate the string selecting control voltage according to an ambient temperature during a writing operation performed on the plurality of memory cell strings. Wherein each of the plurality of memory cell strings is inhibited, programmed or quick pass written during the writing operation.

17 Claims, 4 Drawing Sheets

FLASH MEMORY DEVICE AND CONTROL METHOD

BACKGROUND

Technical Field

The invention relates to a flash memory device and a control method for the flash memory device, and particularly relates to the control method for enlarging a window of a string selecting control voltage of the flash memory device.

Description of Related Art

In a conventional technical field, a flash memory device merely provides a string selecting control voltage for turning on or cut-off a plurality of string selecting switches during a writing operation. When the writing operation of the flash memory device includes a programming operation, an inhibiting operation and a quick pass writing operation, a voltage level of the string selecting control voltage will be limited to a voltage window with a certain width. The width of the voltage window can be affected by voltage level of an operation power of the flash memory device and an ambient temperature. In the conventional art, the string selecting control voltage is isolated from the ambient temperature, and the width of the voltage window will become too narrow when the ambient temperature varied. The string selecting switches cannot be well controlled, and performance of the writing operation will be reduced.

SUMMARY

The invention is directed to a flash memory device and a control method of the flash memory device, which are capable of enlarging a window of a string selecting control voltage of the flash memory device.

The invention provides the flash memory device including a plurality of memory cell strings and a string selecting control voltage generator. The memory cell strings respectively have a plurality of string selecting switches, wherein the plurality of string selecting switches are controlled by a string selecting control voltage. The string selecting control voltage generator is coupled to the memory cell strings, and generate the string selecting control voltage according to an ambient temperature during a writing operation performed on the plurality of memory cell strings. Wherein each of the plurality of memory cell strings is inhibited, programmed or quick pass written during the writing operation.

The invention also provides the control method for a writing operation of a flash memory device. The control method includes: performing the writing operation on a plurality of memory cell strings of the memory device, wherein each of the plurality of memory cell strings has a string selecting switch; generating a string selecting control voltage according to an ambient temperature; and providing the string selecting control voltage to the plurality of string selecting switches, wherein each of the plurality of memory cell strings is inhibited, programmed or quick pass written during the writing operation.

Based on the above description, the string selecting control voltage generator of present disclosure provides the string selecting control voltage with a temperature compensation scheme. That is, the string selecting control voltage can be varied with a variation of the ambient temperature. Such as that, a window of the string selecting control voltage can be maintained for setting the memory cell string to be inhibited, programmed or quick pass written, and the writing operation of the flash memory device can be performed correctly.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
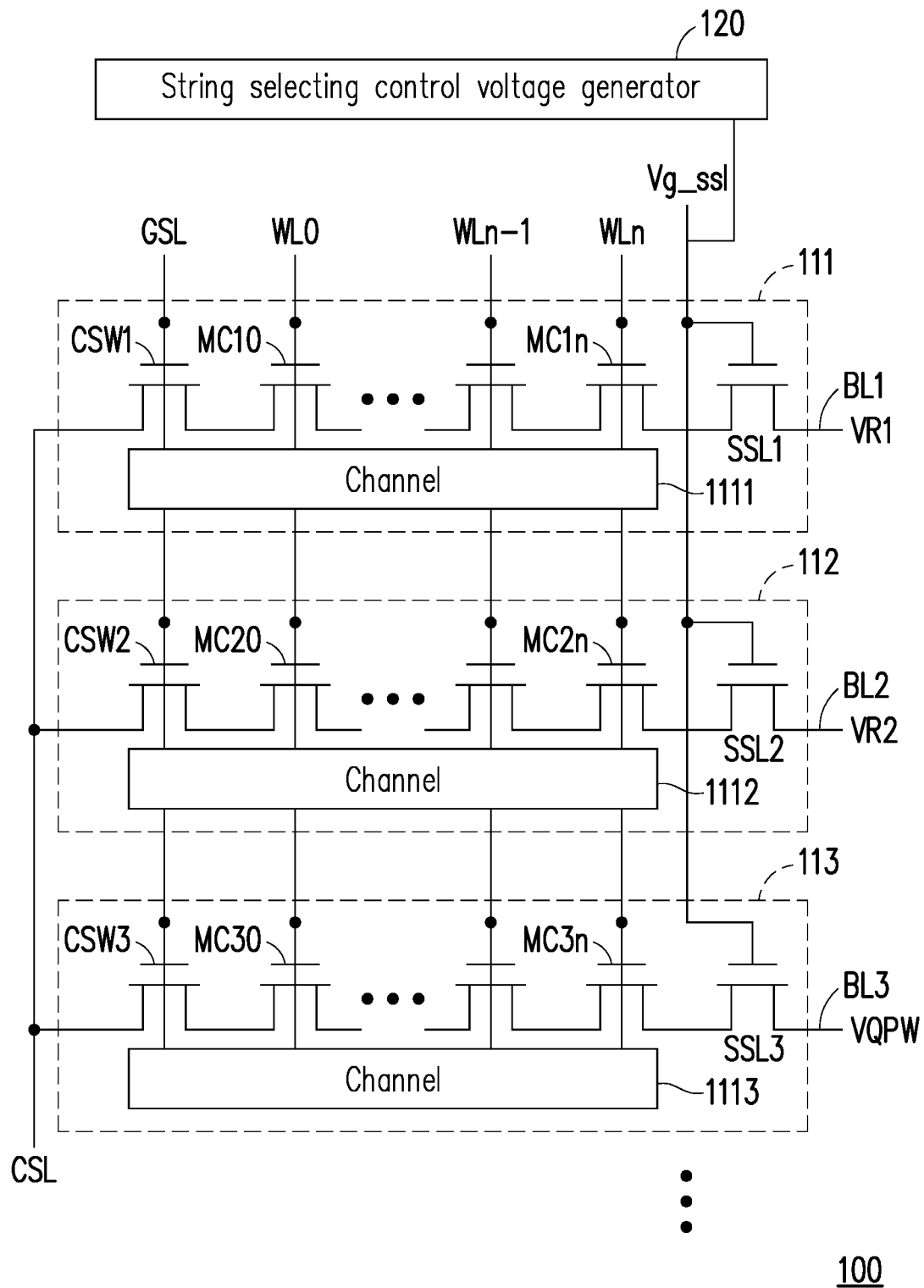
FIG. 1 is a schematic diagram of a flash memory device according to an embodiment of present disclosure.

Referring to FIG. 1, FIG. 1 is a schematic diagram of a flash memory device according to an embodiment of present disclosure. The flash memory device 100 includes a plurality of memory cell strings 111-113 and a string selecting control voltage generator 120. The memory cell string 111 includes a plurality of memory cells MC10-MC1$n$, a string selecting switch SSL1 and a source line switch CSW1; the memory cell string 112 includes a plurality of memory cells MC20-MC2$n$, a string selecting switch SSL2 and a source line switch CSW2; and the memory cell string 113 includes a plurality of memory cells MC30-MC3$n$, a string selecting switch SSL3 and a source line switch CSW3. In present embodiment, the memory cell strings 111-113 are NAND type flash memory strings. The memory cell strings 111-113 are coupled to a common source line through the source line switch CSW1-CSW3, respectively. The source line switch CSW1-CSW3 are controlled by a control signals GSL.

On the other hand, the string selecting control voltage generator 120 is coupled to the string selecting switches SSL1-SSL3. The string selecting control voltage generator 120 is used to generate a string selecting control voltage Vg_ssl, and provides the string selecting control voltage Vg_ssl to control ends of the string selecting switches SSL1-SSL3. The string selecting switches SSL1-SSL3 are respectively coupled to bit lines BL1-BL3. By turning on the string selecting switches SSL1-SSL3, voltages on the bit lines BL1-BL3 can be passed into channels 1111-1113 of the memory cell strings 111-113, respectively.

In this embodiment, the source line switch CSW1-CSW3 and the string selecting switches SSL1-SSL3 can be implemented by transistors. The memory cells MC10-MC3$n$ can be implemented by float gate transistors or any other structures of flash memory cell well known by a person skilled in this art, and no more special limitation here.

In present embodiment, during a writing operation, if the memory cell strings 111-113 are respectively selected to be inhibited, programmed and quick pass written. The string selecting control voltage generator 120 can be configured to provide the string selecting control voltage Vg_ssl to turn on the string selecting switches SSL2-SSL3 and cut-off the string selecting switch SSL1. In detail, when the memory cell string 111 is selected to be inhibited during the writing operation, the string selecting switch SSL1 may receives a first reference voltage VR1, and the string selecting switch SSL1 is cut-off according to the string selecting control voltage Vg_ssl. When the memory cell string 112 is selected to be programmed during the writing operation, the string selecting switch SSL2 may receive a second reference voltage VR2, and the string selecting switch SSL2 is turned on according to the string selecting control voltage Vg_ssl. Besides, when the memory cell string 113 is selected to be programmed during the writing operation, the string selecting switch SSL3 may receive a quick pass write voltage VQPW, and the string selecting switch SSL3 is turned on according to the string selecting control voltage Vg_ssl. Since the string selecting switch SSL1 is cut-off, the first reference voltage VR1 can be isolated from the channel 1111, and charge of the channel 1111 can be kept. On the other hand, since the string selecting switches SSL2-SSL3 are turned on, the reference voltage VR2 and the quick pass write voltage VQPW can be respectively passed into the channels 1112 and 1113. In present disclosure, the first reference voltage VR1 may be larger than the quick pass write voltage VQPW, and the quick pass write voltage VQPW may be larger than the second reference voltage VR2. In some embodiment, the first reference voltage VR1 may be an operation voltage of the flash memory device 100, and the second reference voltage VR2 may be a ground voltage of the flash memory device 100.

In additional, the quick pass write operation of present disclosure is used to perform a light program operation on a memory cell. Comparing with a normal program operation, in an Increment Step Programming Pulse (ISPP) program scheme, the quick pass write operation can be performed by applying a program voltage pulse with lower bias voltage level than the normal program operation. A threshold voltage of the selected memory cell for the quick pass write operation can be adjusted lighter than a normal programmed memory cell.

Figure 2:
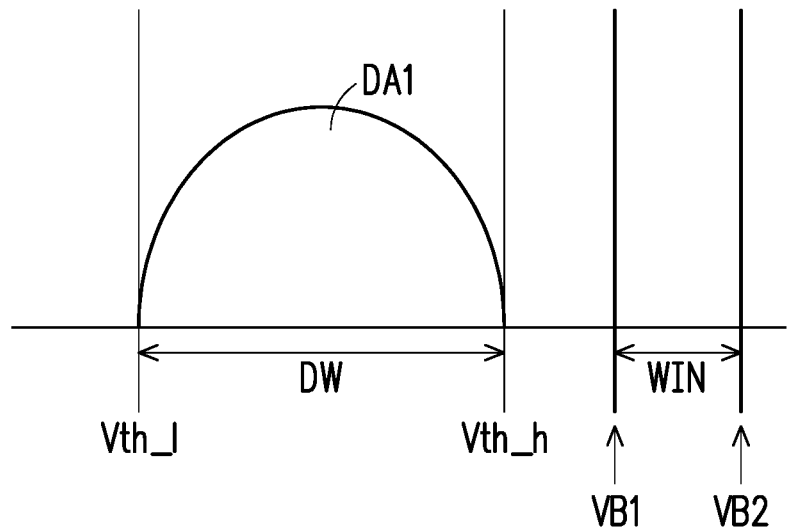
FIG. 2 is a distribution plot of threshold voltages of the string selecting switches according to an embodiment of present disclosure.

Please refer to FIG. 1 and FIG. 2, wherein FIG. 2 is a distribution plot of threshold voltages of the string selecting switches according to an embodiment of present disclosure. In FIG. 2, a horizontal axis is a voltage value and a vertical axis is an amount of the string selecting switches in the flash memory device. According to the threshold voltages of the string selecting switches in the flash memory device, a distribution area DA1 can be formed, between a lower bond Vth_l and an upper bond Vth_h, and the distribution area DA1 has a distribution width DW. For turning on the string selecting switches SSL2-SSL3 and cutting off the string selecting switch SSL1 by the same string selecting control voltage Vg_ssl, the string selecting control voltage Vg_ssl need to be set by following equations (1)-(3):

$$Vg\_ssl < (Vth\_l + VR1 - V\_mg\_off) \quad \text{equation (1),}$$

$$Vg\_ssl > (Vth\_h + Vmg\_on) \quad \text{equation (2),}$$

$$Vg\_ssl > (Vth\_h + VQPW + Vmg\_on) \quad \text{equation (3).}$$

Wherein the voltages V_mg_off and Vmg_on are two margin voltages which can be pre-set by designer. The voltages V_mg_off and Vmg_on is used to increase reliability of the writing operation and may be larger or equal to 0 volts.

For meeting all of requirements of equations (1)-(3), the string selecting control voltage generator 120 needs to generate the string selecting control voltage Vg_ssl between a voltage value VB1 and a voltage value VB2 in FIG. 2, where the voltage value VB1=Vth_h+VQPW+Vmg_on, the voltage value VB2=Vth_l+VR1−V_mg_off, and the voltage values VB1 and VB2 forms a voltage window WIN.

Figure 3:
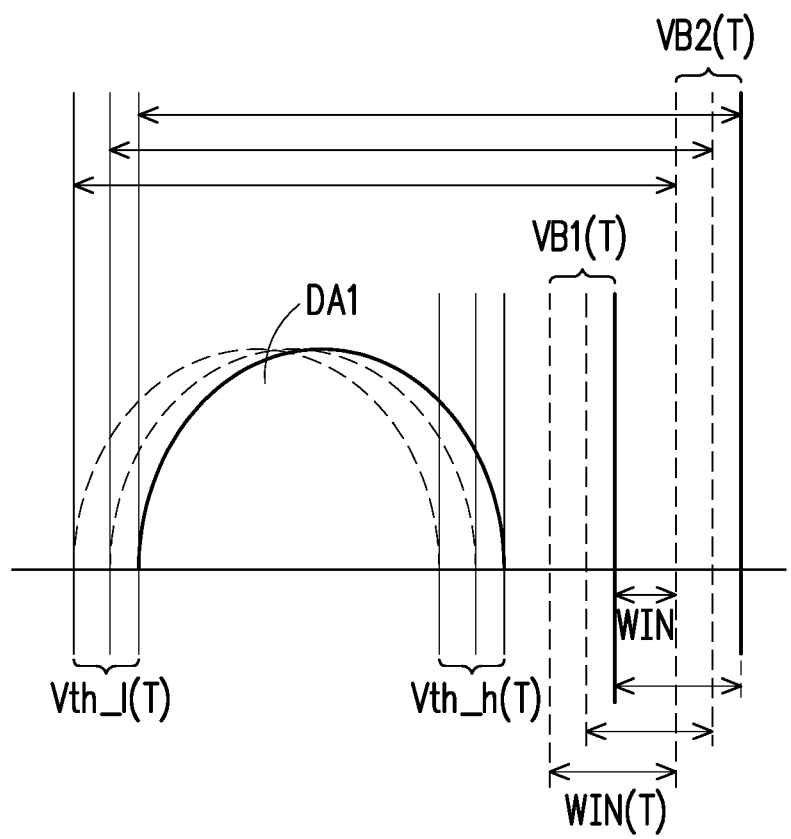
FIG. 3 is a distribution plot with temperature variation of threshold voltages of the string selecting switches according to the embodiment in FIG. 2 of present disclosure.

Please also refer to FIG. 3, which is a distribution plot with temperature variation of threshold voltages of the string selecting switches according to the embodiment in FIG. 2 of present disclosure. In physical used, an ambient temperature of the flash memory device 200 may be varied, and the distribution area DA1 can varied according to the variation of the ambient temperature. Such as that, the upper bond Vth_h and the lower bond Vth_l of the distribution area DA1 can be represented by functions with a variable temperature T (i.e. upper bond Vth_h(T), and lower bond Vth_l(T)). Correspondingly, the voltage value VB1 and VB2 also can be represented by functions with the variable temperature T.

In this case, if the string selecting control voltage generator 120 merely can generate the string selecting control voltage Vg_ssl isolated from the ambient temperature, a width of the voltage window WIN is narrowed. For overcoming this problem, in present disclosure, the string selecting control voltage generator 120 can generate the string selecting control voltage Vg_ssl according to the ambient temperature during the writing operation, and a width of a compensated voltage window WIN(T) can be kept well.

Figure 4A:
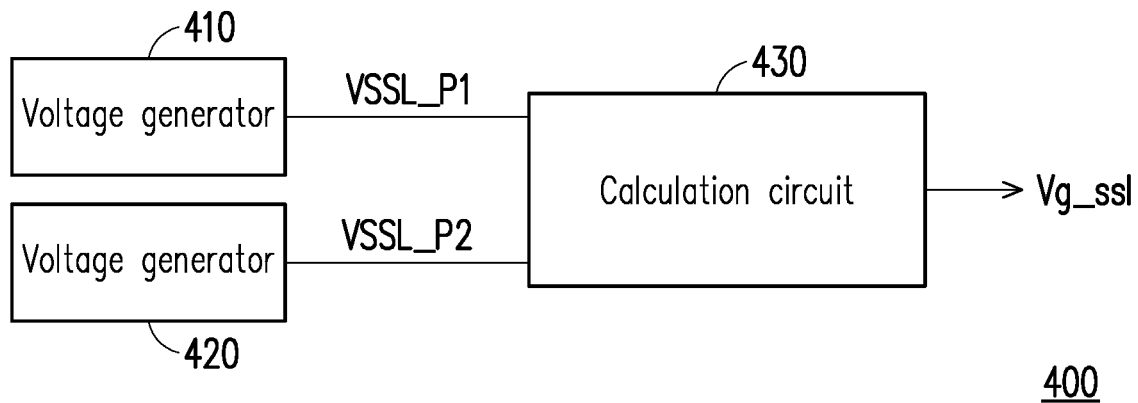
FIG. 4A is a block diagram of a string selecting control voltage generator of a flash memory device according to an embodiment of present disclosure.

Please refer to FIG. 4A, which is a block diagram of a string selecting control voltage generator of a flash memory device according to an embodiment of present disclosure. The string selecting control voltage generator 400 includes voltage generators 410, 420 and an calculation circuit 430. The voltage generator 410 is used to generate a first voltage VSSL_P1 with a first temperature coefficient, and the voltage generators 420 is used to generate a second voltage VSSL_P2 with a second temperature coefficient, where the first temperature coefficient is different from the second temperature coefficient. Furthermore, in this embodiment, the first voltage VSSL_P1 may be a proportional to absolute temperature (PTAT) voltage, and the second voltage VSSL_P2 may be a constant to absolute temperature (CTAT) voltage.

About a hardware structure of the voltage generator 410, the voltage generator 410 can be implemented by a semiconductor component with positive or negative temperature coefficient. For example, the voltage generator 410 can include one or more thermal resistor(s) with positive temperature coefficient or negative temperature coefficient. The voltage generators 410 can further generates the first voltage VSSL_P1 through the thermal resistor(s) by providing a bias voltage on the thermal resistor(s). Such as that, the first voltage VSSL_P1 can be the PTAT voltage. In here, each of the thermal resistor(s) can be replaced by a transistor, a diode, a capacitor or any other device which is sensitive to the temperature and well known by a person skilled in this art.

About a hardware structure of the voltage generator 420, the voltage generator 420 may be implement by a bandgap voltage generator well known by a person skilled in this art. As the person skilled in the art known, the bandgap voltage generator can perform a temperature compensation scheme, and generate the second voltage VSSL_P2 which is the CTAT voltage.

On the other hand, the calculation circuit 430 is coupled to the voltage generators 410 and 420. The calculation circuit 430 receives the first voltage VSSL_P1 and the second voltage VSSL_P2, and performs an arithmetic operation on the first voltage VSSL_P1 and the second voltage VSSL_P2 to generate the string selecting control voltage Vg_SSL.

Figure 4B:
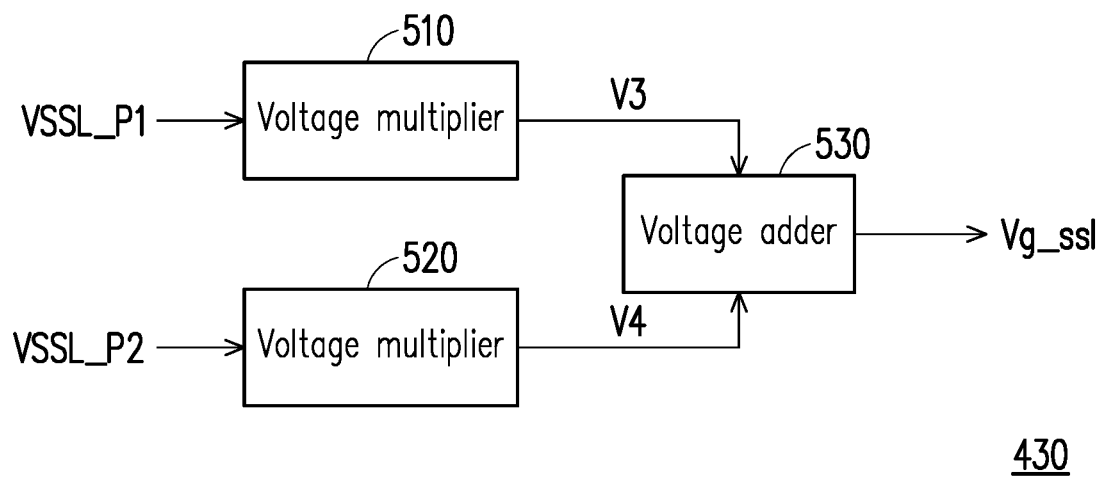
FIG. 4B is a schematic diagram of an calculation circuit according to an embodiment of present disclosure.

About detail structure of the calculation circuit 430, please refer to FIG. 4B which is a schematic diagram of an calculation circuit according to the embodiment in FIG. 4A of present disclosure. The calculation circuit 430 includes voltage multipliers 510 and 520, and a voltage adder 530. The voltage multiplier 510 is used to receive the first voltage VSSL_P1, and multiplies the first voltage VSSL_P1 by a first factor P to generate a voltage V3. The voltage multiplier 520 is used to receive the second voltage VSSL_P2, and multiplies the second voltage VSSL_P2 by a second factor Q to generate a voltage V4. The voltage adder 530 is coupled to the voltage multipliers 510 and 520. The voltage adder 530 add the voltage V3 with the voltage V4 to generate the string selecting control voltage Vg_ssl, and the string selecting control voltage Vg_ssl can be dependent on the ambient temperature.

In this embodiment, the first factor P and the second factor Q may be real number. For example, the first factor P can be a negative real number, and the second factor Q can be a positive real number. The first factor P and the second factor Q can be pre-set by the designer, no more special limitation here.

On the other hand, the voltage multipliers 510 and 520 may be implemented by any analogy or digital voltage multiplication circuits well known by a person skilled in this art. The voltage adder 530 may be implemented by any analogy or digital voltage summation circuit well known by a person skilled in this art. In some embodiment, the voltage adder 530 may be a voltage subtractor when both of the first factor P and the second factor Q are positive real numbers, too.

Figure 5:
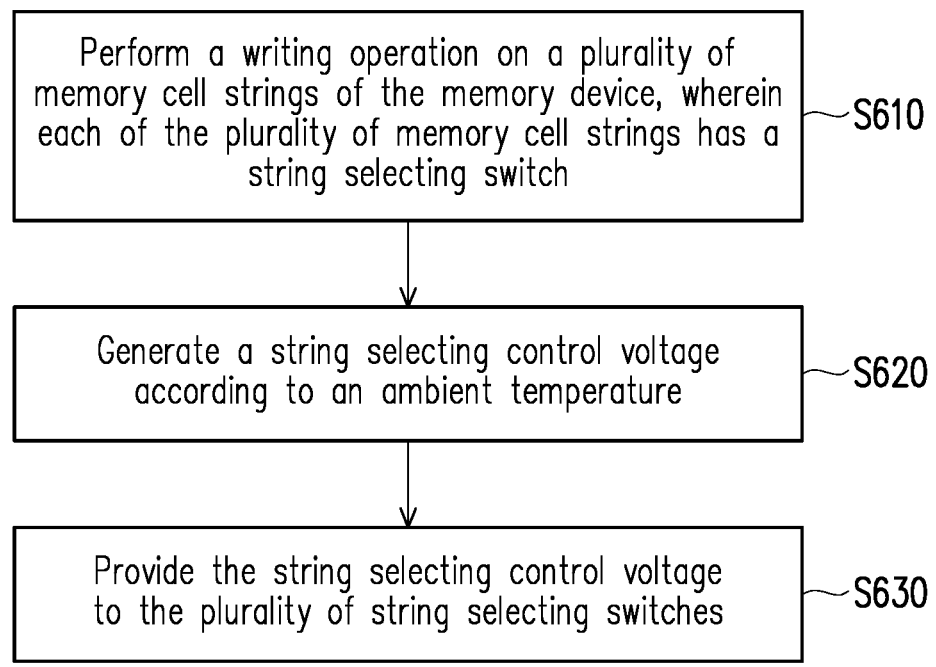
FIG. 5 illustrates a flow chart of a control method for a writing operation of a flash memory device.

Please refer to FIG. 5, which illustrates a flow chart of a control method for a writing operation of a flash memory device. The flash memory device may be a NAND type flash memory device. The control method is used to generate a string selecting control voltage during the writing operation. In a step S610, a writing operation is performed on a plurality of memory cell strings of the memory device, wherein each of the plurality of memory cell strings has a string selecting switch. In a step S620, a string selecting control voltage is generated according to an ambient temperature. In a step S630, the string selecting control voltage can be provided to the plurality of string selecting switches. Wherein, each of the plurality of memory cell strings is inhibited, programmed or quick pass written during the writing operation.

Detail operations about the steps S610-S630 have been described in the embodiments mentioned above, and no more repeated description here.

In summary, the flash memory device of present disclosure generates the string selecting control voltage according to an ambient temperature. Such as that, a voltage window of the string selecting control voltage will not be limited because of temperature variation. An efficiency of write operation for the flash memory device can be maintained.

What is claimed is:

1. A flash memory device, comprising:
a plurality of memory cell strings, respectively have a plurality of string selecting switches, wherein the plurality of string selecting switches are controlled by a string selecting control voltage; and
a string selecting control voltage generator, coupled to the memory cell strings, and generating the string selecting control voltage according to an ambient temperature during a writing operation performed on the plurality of memory cell strings,
wherein each of the plurality of memory cell strings is inhibited, programmed or quick pass written during the writing operation,
wherein the string selecting control voltage generator comprises:
a first voltage generator, generates a first voltage with a first temperature coefficient,
a second voltage generator, generates a second voltage with a second temperature coefficient, wherein the first temperature coefficient is different from the second temperature coefficient; and
a calculation circuit, perform an arithmetic operation on the first voltage and the second voltage to generate the string selecting control voltage.

2. The flash memory device as claimed in claim 1, wherein the first voltage is a proportional to absolute temperature (PTAT) voltage, and the second voltage is a constant to absolute temperature (CTAT) voltage.

3. The flash memory device as claimed in claim 1, wherein the calculation circuit comprises:
a first voltage multiplier, multiplying the first voltage by a first factor to generate a third voltage;
a second voltage multiplier, multiplying the second voltage by a second factor to generate a fourth voltage; and
a voltage adder, coupled to the first voltage multiplier and the second voltage multiplier, generating the string selecting control voltage by adding the third voltage and the fourth voltage,
wherein the first factor and the second factor are real numbers.

4. The flash memory device as claimed in claim 1, wherein the memory cell strings comprises a first memory cell string, a second memory cell string and a third memory cell string, the string selecting control voltage generator provides the string selecting control voltage to a first string selecting switch of the first memory cell string, a second string selecting switch of the second memory cell string, and a third string selecting switch of the third memory cell string during the writing operation, and the first memory cell string is inhibited, the second memory cell string is programmed, and the third memory cell string is quick pass written.

5. The flash memory device as claimed in claim 4, wherein the first string selecting switch, the second string selecting switch and the third string selecting switch respectively receive a first reference voltage, a second reference voltage and a quick pass write voltage during the writing operation, wherein the first reference voltage is larger than the quick pass write voltage, and the quick pass write voltage is larger than the second reference voltage.

6. The flash memory device as claimed in claim 5, wherein the first string selecting switch is cut off, and the second string selecting switch and the third string selecting switch are turned on during the writing operation.

7. The flash memory device as claimed in claim 1, wherein each of the plurality of memory cell strings is NAND type flash memory cell string.

8. A control method for a writing operation of a flash memory device, comprising:
performing a writing operation on a plurality of memory cell strings of the memory device, wherein each of the plurality of memory cell strings has a string selecting switch;
generating a first voltage with a first temperature coefficient;

generating a second voltage with a second temperature coefficient, wherein the first temperature coefficient is different from the second temperature coefficient;

performing an arithmetic operation on the first voltage and the second voltage to generate a string selecting control voltage; and providing the string selecting control voltage to the plurality of string selecting switches, wherein each of the plurality of memory cell strings is inhibited, programmed or quick pass written during the writing operation.

9. The control method as claimed in claim 8, wherein the first voltage is a proportional to absolute temperature (PTAT) voltage, and the second voltage is a constant to absolute temperature (CTAT) voltage.

10. The control method as claimed in claim 8, wherein a step of performing the arithmetic operation on the first voltage and the second voltage to generate the string selecting control voltage comprises:

multiplying the first voltage by a first factor to generate a third voltage;

multiplying the second voltage by a second factor to generate a fourth voltage; and generating the string selecting control voltage by adding the third voltage and the fourth voltage, wherein the first factor and the second factor are real numbers.

11. The control method as claimed in claim 8, wherein a step of performing the writing operation on the plurality of memory cell strings of the memory device comprises:

providing the string selecting control voltage to a first string selecting switch of the first memory cell string to set the first memory cell string to be inhibited;

providing the string selecting control voltage to a second string selecting switch of the second memory cell string to set the second memory cell string to be programmed; and providing the string selecting control voltage to a third string selecting switch of the third memory cell string to set the third memory cell string to be quick pass written.

12. The control method as claimed in claim 11, further comprising:

respectively providing a first reference voltage, a second reference voltage and a quick pass write voltage to the first string selecting switch, the second string selecting switch and the third string selecting switch during the writing operation, wherein the first reference voltage is larger than the quick pass write voltage, and the quick pass write voltage is larger than the second reference voltage.

13. The control method as claimed in claim 12, wherein the first string selecting switch is cut off, and the second string selecting switch and the third string selecting switch are turned on during the writing operation.

14. The control method as claimed in claim 8, wherein each of the plurality of memory cell strings is NAND type flash memory cell string.

15. A string selecting control voltage generator, adapted for a flash memory device, comprising:

a first voltage generator, generates a first voltage with a first temperature coefficient;

a second voltage generator, generates a second voltage with a second temperature coefficient, wherein the first temperature coefficient is different from the second temperature coefficient; and a calculation circuit, perform an arithmetic operation on the first voltage and the second voltage to generate a string selecting control voltage, wherein the string selecting control voltage generator is coupled to a plurality of memory cell string of the flash memory device, and generates the string selecting control voltage according to an ambient temperature during a writing operation performed on the plurality of memory cell strings, wherein each of the plurality of memory cell strings is inhibited, programmed or quick pass written during the writing operation.

16. The string selecting control voltage generator as claimed in claim 15, wherein the first voltage is a proportional to absolute temperature (PTAT) voltage, and the second voltage is a constant to absolute temperature (CTAT) voltage.

17. The string selecting control voltage generator as claimed in claim 15, wherein the calculation circuit comprises:

a first voltage multiplier, multiplying the first voltage by a first factor to generate a third voltage;

a second voltage multiplier, multiplying the second voltage by a second factor to generate a fourth voltage; and a voltage adder, coupled to the first voltage multiplier and the second voltage multiplier, generating the string selecting control voltage by adding the third voltage and the fourth voltage, wherein the first factor and the second factor are real numbers.

* * * * *